United States Patent [19]

Chan et al.

[11] Patent Number: 4,752,913

[45] Date of Patent: Jun. 21, 1988

[54] RANDOM ACCESS MEMORY EMPLOYING COMPLEMENTARY TRANSISTOR SWITCH (CTS) MEMORY CELLS

[75] Inventors: Yuen H. Chan, Poughkeepsie; James R. Struk, Wappingers Falls, both of N.Y.

[73] Assignee: International Business Machines Corporation, Armonk, N.Y.

[21] Appl. No.: 857,903

[22] Filed: Apr. 30, 1986

[51] Int. Cl.[4] .............................................. G11C 7/00
[52] U.S. Cl. .................................... 365/190; 365/189; 365/230
[58] Field of Search ............... 365/230, 189, 155, 179, 365/204, 190; 307/299, 455, 467, 449, 463, 578, 482

[56] References Cited

U.S. PATENT DOCUMENTS

| | | | |
|---|---|---|---|
| 4,191,899 | 3/1980 | Tomczak et al. | 307/482 |
| 4,330,853 | 5/1982 | Heimeier | 365/189 |
| 4,578,779 | 3/1986 | Chan et al. | 365/230 |
| 4,596,002 | 6/1986 | Chan et al. | 365/189 |
| 4,598,390 | 7/1986 | Chan | 365/189 |

OTHER PUBLICATIONS

Chan et al., "SCR Pull Up Circuit", IBM Technical Disclosure Bulletin, vol. 26, No. 10A, Mar. 1984, pp. 5036-5038.

Primary Examiner—Stuart N. Hecker
Assistant Examiner—Glenn A. Gossage
Attorney, Agent, or Firm—John D. Crane; Wesley DeBruin

[57] ABSTRACT

Disclosed is an improved bit selection circuit for a RAM, in particular one employing CTS (complementary transistor switch) cells. The bit select circuitry includes interconnected first and second level matrix decoders, each memory column has a pair of bit lines, each pair of bit lines has connected thereto a bit select circuit, each of the bit select circuits being connected to an output of the second level decoder, a bit up-level clamp circuit connected to each of the bit select circuits of each pair of bit lines, each of the bit select circuits including a first circuit for increasing the speed of selection of the selected pair of lines, the bit up-level clamp circuit cooperating with the bit select circuit of the selected pair of bit lines for positively limiting the upper potential level of the selected pair of bit lines, and each of the bit select circuits including a second circuit for increasing the speed of deselection of the selected pair of bit lines.

10 Claims, 14 Drawing Sheets

"UNCLAMPED" CTS CELL

ADDRESS RECEIVER

BIT DECODER CIRCUIT

BIT SELECT CIRCUIT

BIT-UP-LEVEL CLAMP CIRCUIT

VOLTAGE MODE WORD SELECTION

WORD DECODER

SENSE AMPLIFIER CIRCUIT

SENSE AMPLIFIER ARRANGEMENT

VOLTAGE MODE READ OPERATION

VOLTAGE MODE WRITE OPERATION

WRITE OPERATION WAVEFORMS

RANDOM ACCESS MEMORY EMPLOYING COMPLEMENTARY TRANSISTOR SWITCH (CTS) MEMORY CELLS

CROSS REFERENCE TO RELATED U.S. PATENT APPLICATION

U.S. patent application Ser. No. 624,488 entitled "Improved Random Access Memory Array Employing Complementary Transistor Switch (CTS) Memory Cells" filed June 25, 1984 by Y. H. Chan, F. D. Jones and W. F. Stinson now U.S. Pat. No. 4,596,002.

U.S. patent application Ser. No. 624,486, entitled "Voltage Mode Operation Scheme For Bipolar Array" filed June 25, 1984 by Y. H. Chan and J. R. Struk now U.S. Pat. No. 4,578,779.

U.S. patent application Ser. No. 624,489 entitled "Random Access Memory RAM Employing Complementary Transistor Switch (CTS) Memory Cells" filed June 25, 1984, by Y. H. Chan now U.S. Pat. No. 4,598,390.

BACKGROUND OF THE INVENTION

Field of the Invention

The invention is directed to an improved random access memory (RAM). More particularly the invention is directed to improved bit selection circuitry for an array using CTS (Complementary Transistor Switch) memory cells, or "unclamped" CTS memory cells.

Background Art

The following patents and publications are directed to memory array circuitry and more particularly bit selection, word line selection and related circuitry employed therein. It is to be appreciated that the following art is not submitted to be the only, the best, or the most pertinent art.

Patents

U.S. Pat. No. 3,423,737 entitled "Nondestructive Read Transistor Memory Cell" granted Jan. 21, 1969 to L. R. Harper.

U.S. Pat. No. 3,525,084 entitled "Memory Sense System with Fast Recovery" granted Aug. 18, 1970 to L. J. Dunlop et al.

U.S. Pat. No. 3,582,911 entitled "Core Memory Selection Matrix" granted June 1, 1971 to J. P. Smith.

U.S. Pat. No. 3,623,033 entitled "Cross-Coupled Bridge Core Memory Addressing System" granted Nov. 23, 1971 to P. A. Harding.

U.S. Pat. No. 3,636,377 entitled "Bipolar Semiconductor Random Access Memory" granted Jan. 18, 1972 to P. C. Economopoulos et al.

U.S. Pat. No. 3,736,574 entitled "Pseudo-Hierarchy Memory System" granted Dec. 30, 1971 to E. D. Gersbach et al.

U.S. Pat. No. 3,753,008 entitled "Memory Pre-Driver Circuit" granted Aug. 14, 1973 to G. Guarnashelli.

U.S. Pat. No. 3,771,147 entitled "IGFET Memory System" granted Nov. 6, 1973 to H. J. Boll et al.

U.S. Pat. No. 3,786,442 entitled "Rapid Recovery Circuit For Capacitively Loaded Bit Lines" granted January 15, 1974 to S. B. Alexander et al.

U.S. Pat. No. 3,789,243 entitled "Monolithic Memory Sense Amplifier/Bit Driver Having Active Bit/Sense Pull-Up" granted Jan. 29, 1974 to N. M. Donofrio et al.

U.S. Pat. No. 3,843,954 entitled "High-Voltage Integrated Driver Circuit and Memory Embodying Same" granted Oct. 22, 1974 to A. A. Hansen et al.

U.S. Pat. No. 3,863,229 entitled "SCR (or SCS) Memory Array with Internal and External Load Resistors" granted Jan. 28, 1975 to J. E. Gersbach.

U.S. Pat. No. 3,919,566 entitled "Sense-Write Circuit for Bipolar Integrated Circuit Ram" granted Nov. 11, 1975 to M. S. Millhollan et al.

U.S. Pat. No. 3,942,160 entitled "Bit Sense Line Speed-Up Circuit for Mos Ram" granted Mar. 2, 1976 to R. T. Yu.

U.S. Pat. No. 4,007,451 entitled "Method and Circuit Arrangement for Operating A Highly Integrated Monolithic Information Store" granted Feb. 8, 1977 to K. Heuber et al.

U.S. Pat. No. 4,042,915 entitled "Mos Dynamic Random Access Memory Having An Improved Address Decoder Circuit" granted Aug. 16, 1977 to J. A. Reed.

U.S. Pat. No. 4,078,261 entitled "Sense/Write Circuits for Bipolar Random Access Memory" granted Mar. 7, 1978 to M. S. Millhollan et al.

U.S. Pat. No. 4,090,254 entitled "Charge Injector Transistor Memory" granted May 16, 1978 to I. T. Ho et al.

U.S. Pat. No. 4,090,255 entitled "Circuit Arrangement For Operating A Semiconductor Memory System" granted May 16, 1978 to H. H. Berger, et al.

U.S. Pat. No. 4,104,735 entitled "Arrangement for Addressing A Mos Store" granted Aug. 1, 1978 to R. Hofmann.

U.S. Pat. No. 4,172,291 entitled "Preset Circuit For Information Storage Devices" granted Oct. 23, 1979 to W. K. Owens, et al.

U.S. Pat. No. 4,174,541 entitled "Bipolar Monolithic Integrated Circuit Memory With Standby Power Enable" granted Nov. 13, 1979 to C. R. Schmitz.

U.S. Pat. No. 4,194,130 entitled "Digital Predecoding System" granted Mar. 18, 1980 to J. D. Moench.

U.S. Pat. No. 4,200,918 entitled "Control Circuit For The Adaptation of Storage Cells In Bipolar Integrated Circuits" granted Apr. 29, 1980 to H. Glock et al.

U.S. Pat. No. 4,242,605 entitled "Transient Array Drive For Bipolar Rom/Prom" granted Dec. 30, 1980 to W. C. Seelbach.

U.S. Pat. No. 4,264,828 entitled "Mos Static Decoding Circuit" granted Apr. 28, 1981 to G. Peregos et al.

U.S. Pat. No. 4,287,575 entitled "High Speed High Density, Multi-Port Random Access Memory Cell" granted Sept. 1, 1981 to D. H. Eardley et al.

U.S. Pat. No. 4,308,595 entitled "Array Driver" granted Dec. 29, 1981 to R. J. Houghton.

U.S. Pat. No. 4,322,820 entitled "Semiconductor Integrated Circuit Device" granted Mar. 30, 1982 to K. Toyoda.

U.S. Pat. No. 4,323,986 entitled "Electric Storage Array Having DC Stable Conductivity Modulated Storage Cells" granted Apr. 6, 1982 to S. D. Malaviva.

U.S. Pat. No. 4,326,270 entitled "Preset Circuit For Information Storage Devices" granted Apr. 20, 1982 to W. K. Owens et al.

U.S. Pat. No. 4,330,853 entitled "Method of and Circuit Arrangement For Reading and/or Writing An Integrated Semiconductor Storage With Storage Cells In MLT ($I^2L$) Technology" granted May 18, 1982 to H. H. Heimeier et al.

U.S. Pat. No. 4,413,191 entitled "Array Word Line Driver System" granted Nov. 1, 1983 to R. J. Houghton.

U.S. Pat. No. 4,417,159 entitled "Diode-Transistor Active Pull Up Driver" granted Nov. 22, 1983 to J. A. Dorler et al.

U.S. Pat. No. 4,417,326 entitled "Static Semiconductor Memory Device" granted Nov. 22, 1983 to K. Toyoda et al.

PUBLICATIONS

[IBM Technical Disclosure Bulletin (IBM TDB)]

"Static Cell Array Circuit to Enable Write by Turning Off The Cell Load Devices" by D. B. Eardley, IBM TDB, Vol. 24, No. 6, Nov. 1981, pages 3044–47.

"AC Write Scheme For Bipolar Random-Access Memories Using Schottky Coupled Cells" by J. A. Dorler et al, IBM TDB, Vol. 23, No. 11, April 1981, pages 4960-2.

"Constant Voltage, Current Sensing Circuit" by V. Marcello et al, IBM TDB, Vol. 24, No. 1B, June, 1981, pages 483-4.

"Tri-State Read/Write Control Circuit" by V. Marcello et al, IBM TDB Vol 24, No. 1B, June 1981, pages 480-2.

"Read/Write Control Circuit Reference Voltage Generator" by V. Marcello et al, IBM-TDB, Vol. 24, No. 1B, June, 1981, pages 478-9.

"Bit Current Steering Network" by V. Marcello et al, IBM TDB Vol 24, No. 1B, June 1981, pages 475–77.

"Complementary Transistor Switch Memory Cell" by J. A. Dorler et al, IBM TDB, Vol 16, No. 12, May 1984.

"Memory Cell" by S. K. Wiedmann, IBM TDB Vol 13, No. 3, August 1970, pages 616-7.

"A 1024 Byte ECL Random Access Memory Using a Complementary Transistor Switch (CTS) Cell" by J. A. Dorler et al, IBM Journal of Research and Development, Vol. 25, No. 3, May, 1981, pages 126–34.

"Bit Driver and Select Circuit For Schottky-Coupled Cell Arrays" by C. U. Buscaglia et al, IBM TDB, Vol 24, No. 10, March, 1982, pages 5167-8.

"Low Power Write Circuit For Fast VLSI Arrays" by R. D. Dussault et al, IBM TDB, Vol. 24, No. 11A, April, 1982, pages 5630-1.

"Read/Write Scheme For Bipolar Random-Access Memories Using Schottky Coupled Cells" by R. D. Daussault et al, IBM TDB, Vol. 24, No. 11A, April, 1982, pages 5632-3.

Random access memories employing CTS type memory cells are known to the art. See for the example, The Gerbach Pat. No. 3,863,229, the Dorler et al IBM TDB publication, and the Dorler et al IBM Journal of Research and Development Article, each fully identified hereinabove.

At least certain known random access memories and the in particular those employing CTS memory cells have two relatively serious bit selection short comings. First, the bit decode transistor has to drive a number of bit columns across the chip. Due to long metal lines and large fan out current, voltage drop along the bit decode line is high. The cells at the end of the bit decode line may have insufficient voltage across their "1" bit rail resistors to provide adequate gate currents into the cells. This may lead to potential data retention problems on the selected cells. Secondly, both selection and deselection of the bit rails are slow due to the fact that the bit decode transistor has large fan-out loadings. Discharge speed of the bit rails is limited by the bit rail resistors. The bit selection scheme in accordance with the invention obviates the above recited shortcomings.

In high performance arrays using cells like CTS, selection of a cell is accomplished by lowering its word lines and raising its bit rails. At least certain known designs use a fixed current source to pull down the selected word lines. There are three problems usually associated with this method of word selection in "current mode".

(1) Slow speed

With CTS cells, the word lines are very capacitive. (For word lines having 60 to 80 cells, this word line capacitance could be as high as 30 to 40 pf). A constant current source pulls down the selected word lines according to its large RC time constant. Hence cell selection is very slow, and its drive capability is often limiting by the fixed source of current.

(2) Instability

Since the selected word lines are held down by a current source, their voltage levels are easily affected by noise or current source variations. If the word line levels drift to a degree that they no longer track with those of the bit rails, data retention problems could result.

(3) Long address set up time to "write"

During write operation, the bit line voltage of the side to be written a "1" is driven high. This causes the bit rail and the drain line levels to rise. A long address set up time is needed to wait for the previous selected cell to get out of the way before writing can start in order to avoid write-through problems.

The above problems are obviated and overcome by the "voltage mode word selection scheme" disclosed and claimed in afore identified U.S. patent application Ser. No. 624,486 now U.S. Pat. 4,578,779.

SUMMARY OF THE INVENTION

A primary object of the invention is to provide an improved random access memory.

A further object of the invention is to provide an improved random access memory which employs complementary transistor switch (CTS) memory cells, particularly the "unclamped" CTS cells.

A further object of the invention is to provide an improved bit selection scheme for a random access memory.

A further object of the invention is to provide an improved bit selection scheme for a random access memory which employs complementary transistor switch (CTS) memory cells, particularly the "unclamped" CTS cell.

A still further object of the invention is to provide a random access memory employing bit selection circuitry which, particularly in a RAM employing unclamped CTS cells, improves the bit line select and deselect speeds.

The invention may be summarized as improved bit selection circuitry for a RAM, in particular one using CTS (Complementary Transistor Switch) cells. The bit select circuitry includes interconnected first and second level matrix decoders, each memory column has a pair of bit lines, each pair of bit lines has connected thereto bit select circuit means, each of said bit select circuit means being connected to an output of said second level decoder, a bit up-level clamp circuit connected to each of said bit select circuit means of each pair of bit lines, each of said bit select circuit means including first circuit means for increasing the speed of selection of the selected pair of bit lines, said bit up-level clamp circuit cooperating with said bit select circuit means of said selected pair of bit lines for positively limiting the upper potential level of said selected pair of bit lines, and each of said bit select circuit means including second circuit means for increasing the speed of deselection of the selected pair of bit lines. The invention also includes voltage mode word selection means in a RAM preferably employing CTS type memory cells.

The foregoing and other objects, features and advantages of the invention will be apparent from the following more particular description of preferred embodiments of the invention, as illustrated in the accompanying drawings.

BRIEF DESCRIPTION OF THE DRAWING

FIG. 14 is to be viewed in conjunction with the explanation of the WRITE operation (FIG. 13) of the RAM (FIG. 3) in accordance with the invention.

DESCRIPTION OF THE PREFERRED EMBODIMENT

Figure 8:
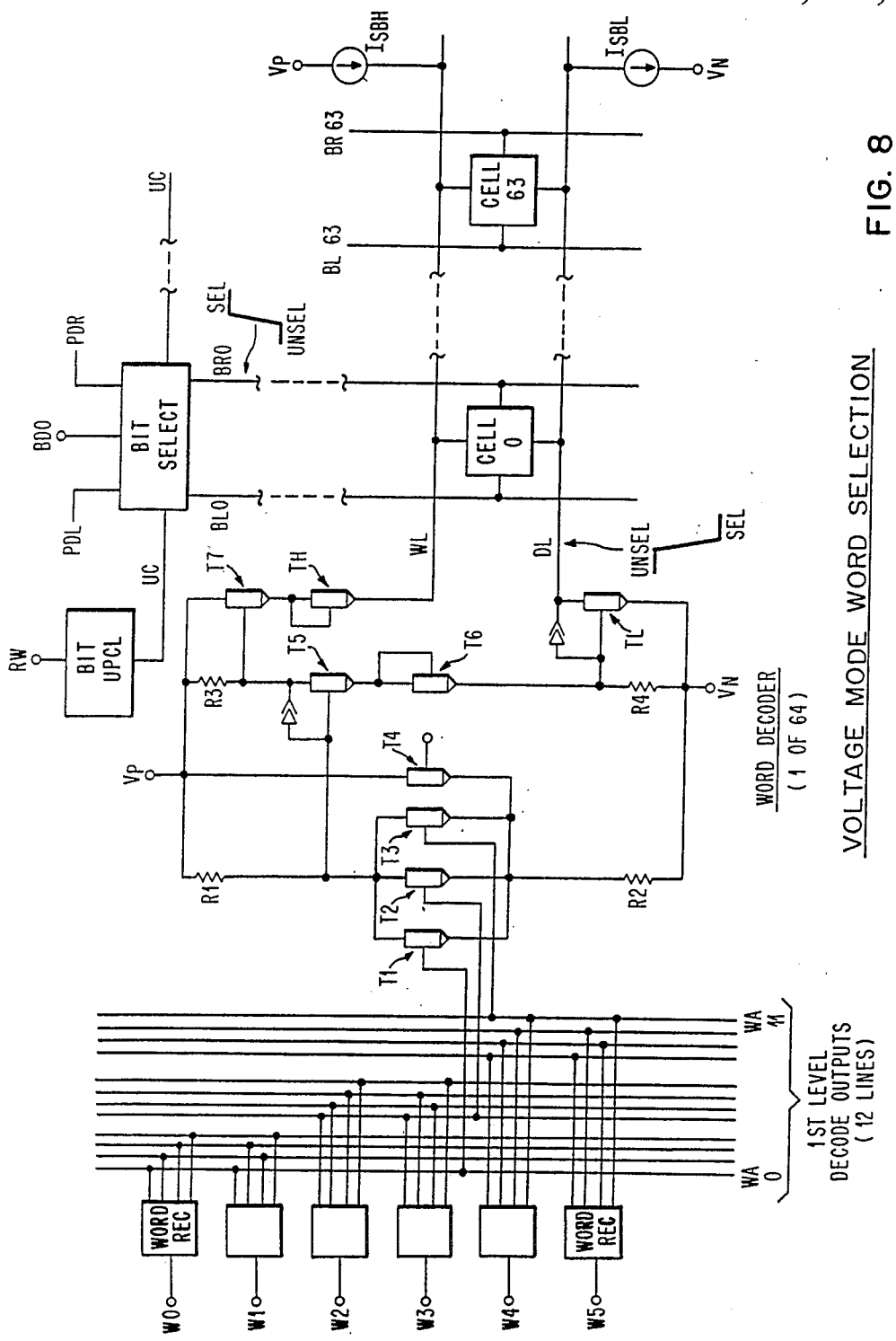
FIG. 8 illustrates the circuit diagram of "voltage mode" word selection scheme which may be employed in a RAM (FIG. 3) in accordance with the invention.

FIG. 8 shows the schematic diagram of a voltage mode word selection circuit which overcomes the problems outlined earlier with respect to "current mode" word selection.

The above problems and concerns are addressed and overcome by the random access memory disclosed hereinafter. Reference is made to the afore-identified U.S. Pat. Nos. 4,596,002, 4,578,779 and 4,598,390.

The above problems are overcome by using distributive bit select circuits and word line selection circuits illustrated FIGS. 3, 3A, 8 and 9.

Figure 1:
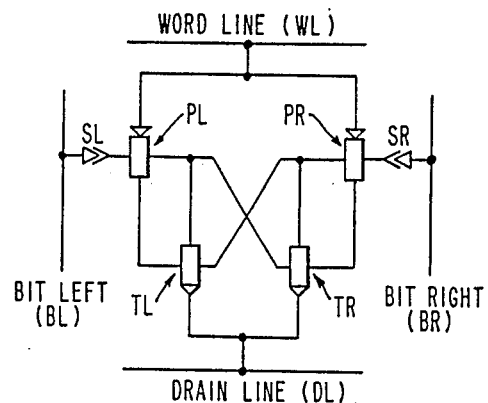
FIG. 1 illustrates the circuit of a known "unclamped" CTS memory cell.
Figure 2:
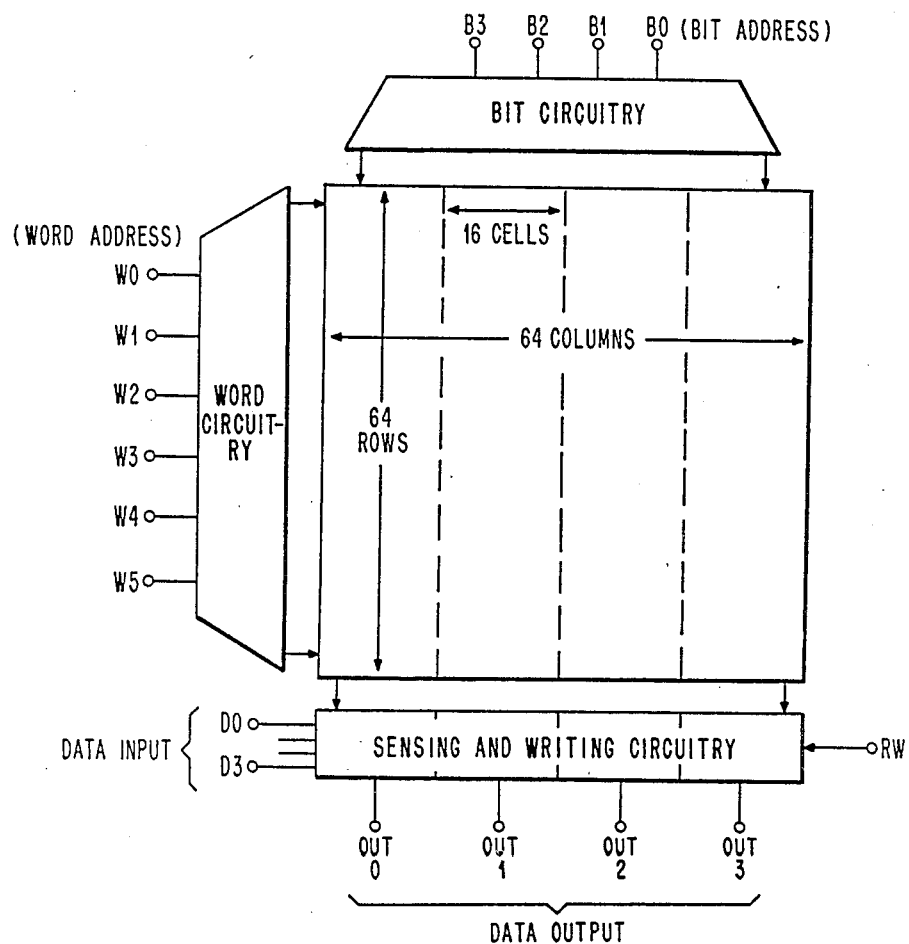
FIG. 2 illustrates a 1k×4 random access memory in accordance with the invention.

For purpose of illustration, FIG. 2 shows a 1k ×4 RAM in accordance with the invention. This RAM has an array density of 4096 cells arranged in 64 words (rows) by 64 bit (columns). The 64 bit columns are further divided into 4 data groups, so that it will write 4 bits (therefore 4 data inputs) and read 4 bits (4 data outputs) at a time. The RAM has 6 bit word addresses (to select 1 out of 64 rows) and 4 bit column addresses (to select 4 out of 64 bits). Read and write operations are controlled by the RW input.

Figure 3:
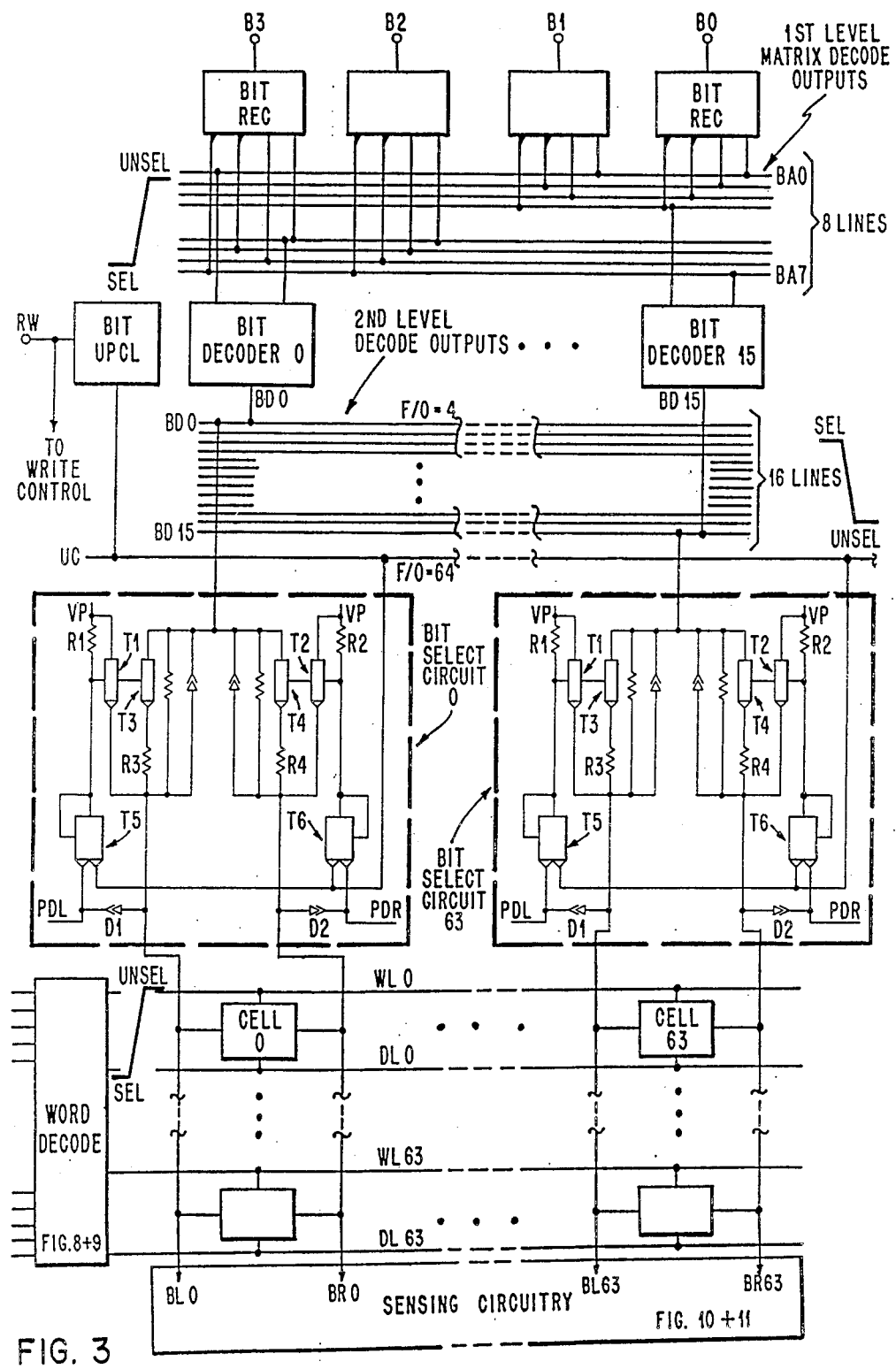
FIG. 3 illustrates the bit path circuitry of the random access memory shown in FIG. 2.
Figure 4:
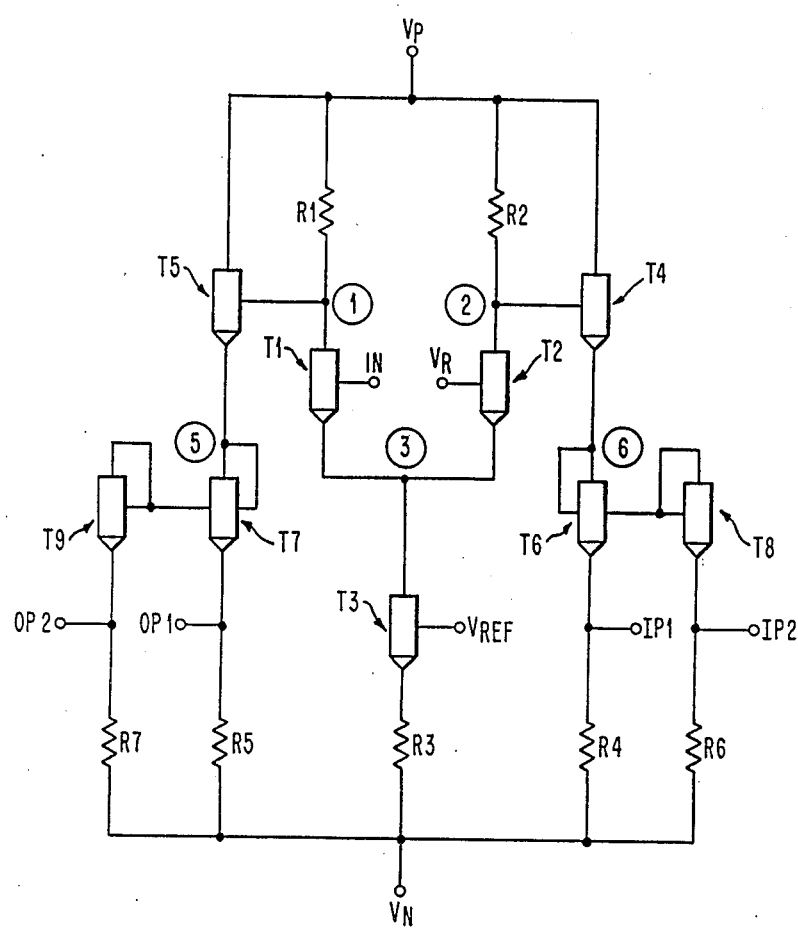
FIG. 4 is a circuit diagram of the address receiver circuits (Bit REC and Word REC) which may be employed in a RAM (FIG. 3) in accordance with the invention.

Referring to FIG. 3, a two level matrix decode scheme is employed for bit address decoding. The first level decode includes two groups of 4 address lines (BA0–BA3 and BA4–BA7) formed from output emitter dotting of the four bit address receivers. The bit address receivers are current switch emitter follower circuits as shown in FIG. 4. They convert the address inputs to true and complement signals. By means of emitter follower output dotting of the address receiver pairs, a partial decode of 1 out of 4 is formed from each group, hence, giving a total of two selected (low level) lines.

Figure 5:
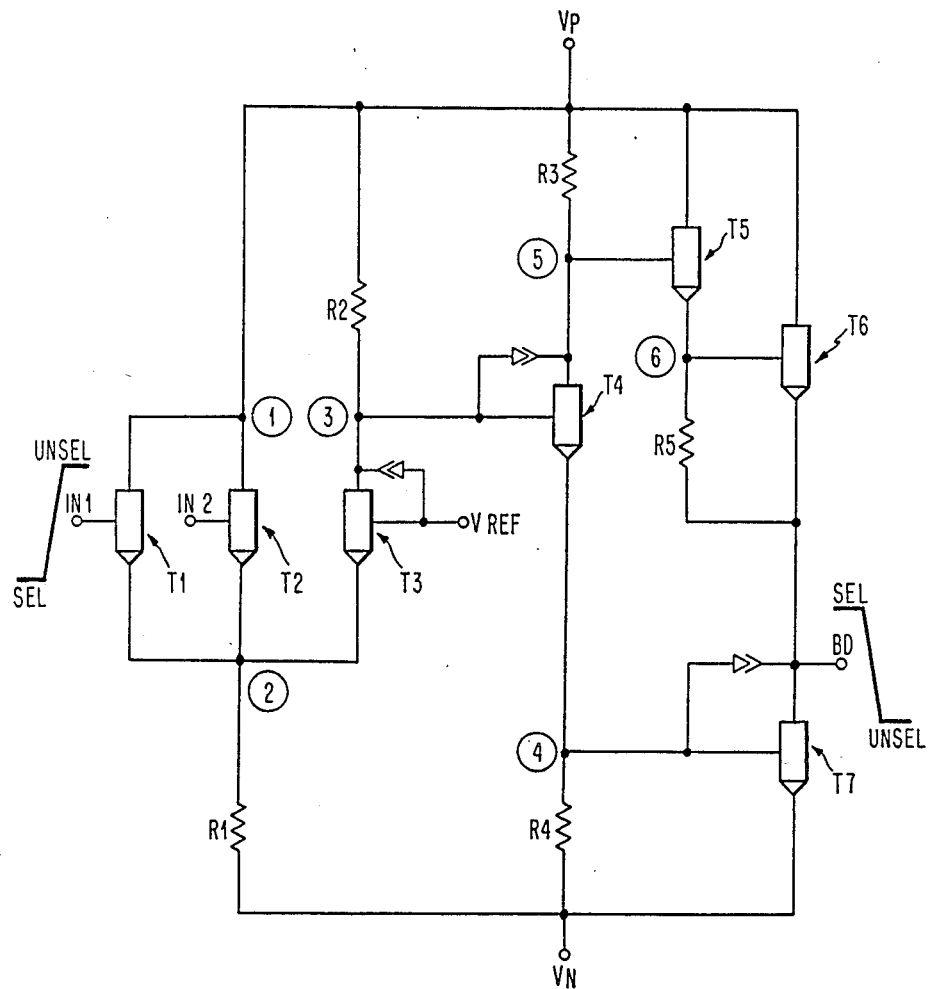
FIG. 5 is a circuit diagram of a bit decoder circuit which may be employed in a RAM (FIG. 3) in accordance with the invention.

The second level decode function is performed by the 16 bit decoders (FIG. 5), which have current switch inputs and high speed push-pull outputs. Input 1 of the bit decoder is connected to one of the 4 lines in BA0--BA3 address group, and input 2 is connected to one in the BA4–BA7 group. Of the 16 BD output lines, only one is decoded to a selected up level. Each BD line fans out to drive four bit columns (one from each data group), so that four cells are selected at a time for READ or WRITE operation.

Each bit column has a bit select circuit (FIGS. 3 and 6) to perform bit line select and deselect functions. The selected bit lines up level is set by a bit up level clamp circuit (Bit UPCL, FIG. 7), so that the cells' read and write operating points can be readily adjusted by changing the up clamp (UC) level.

Figure 6:
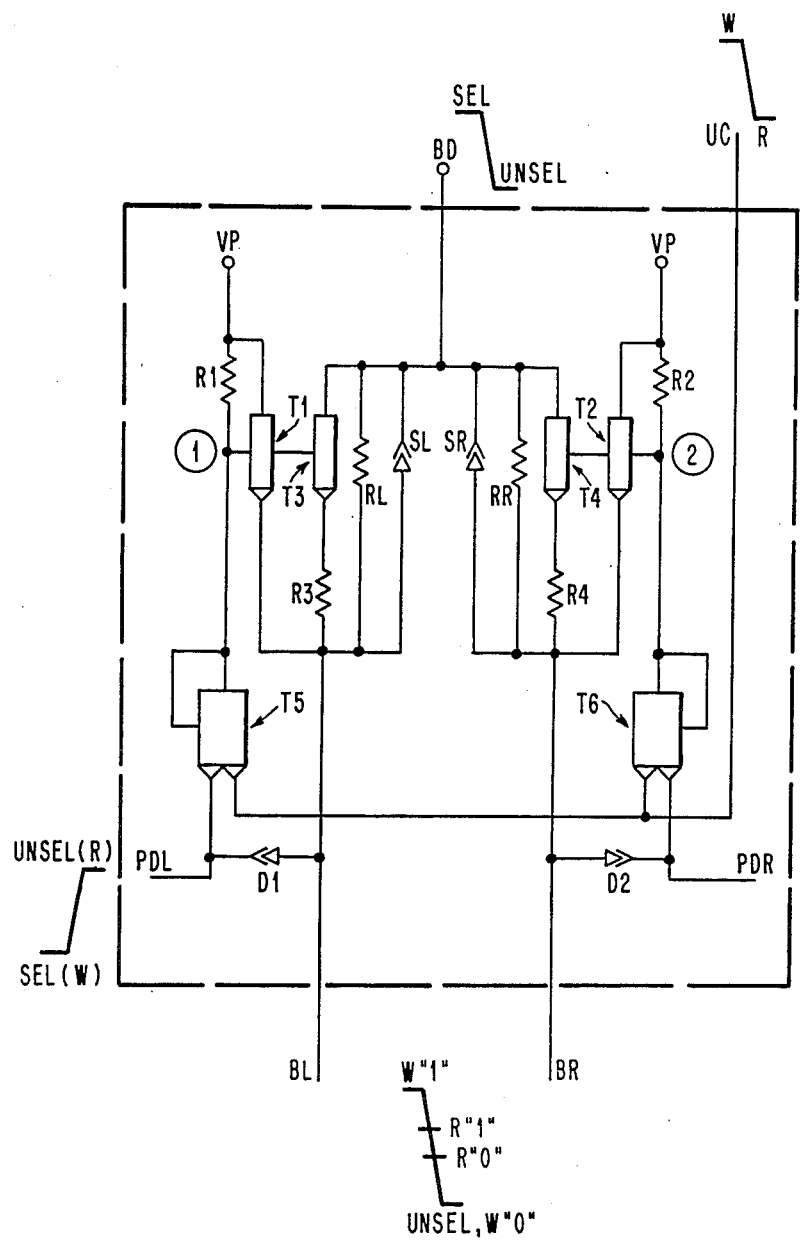
FIG. 6 is a circuit diagram of a bit select circuit in accordance with the invention and which may be employed in a RAM (FIG. 3) in accordance with the invention.
Figure 7:
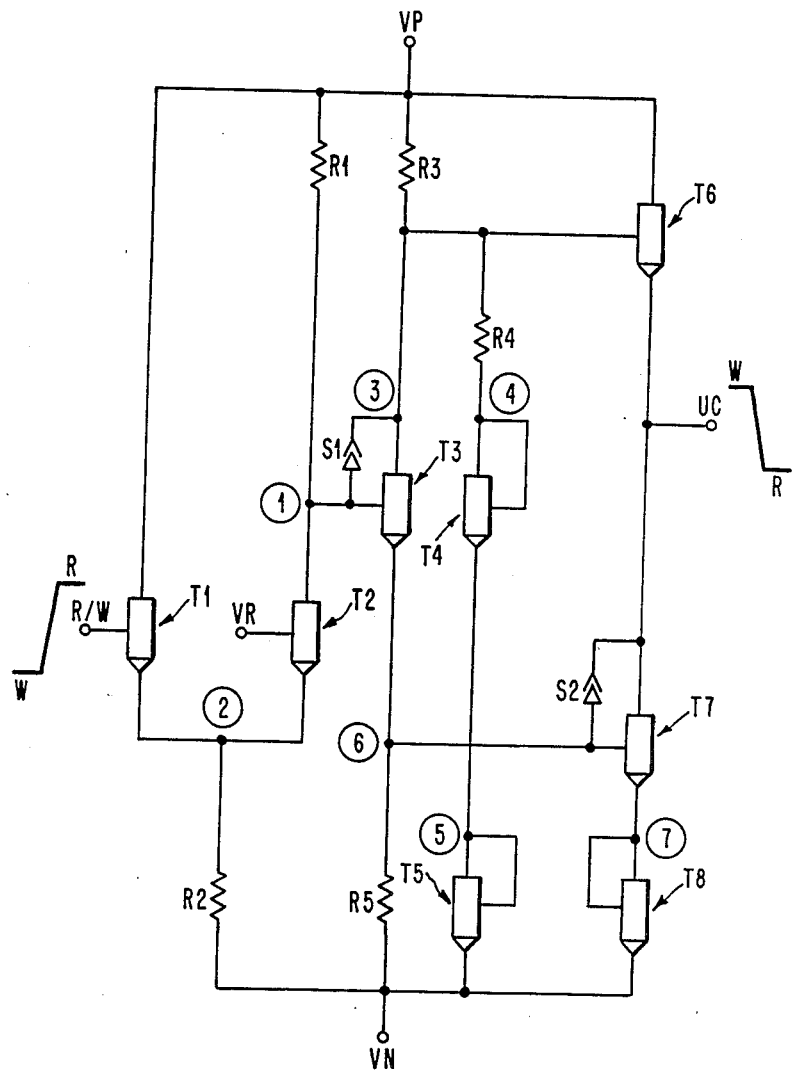
FIG. 7 is a circuit diagram of the bit up-level clamp (Bit UPCL) which may be employed in a RAM (FIG. 3) in accordance with the invention.

For unclamped CTS cell, the SCR device operates in saturation mode. The cell is more capacitive (due to higher B-C junction saturation capacitance) than a normal CTS with Schottky clamp. This makes the unclamped cell very difficult to write. It is essential that the bit select circuit is capable of driving high transient current into the cell to enable fast write performance. To attain fast read access time, the bit select circuit should also have minimal switching delay, and is capable of rapidly charging and discharging a selected bit line. A novel circuit technique utilizing capacitive boot strapping and transient drive mechanism is designed to satisfy these requirements. Referring to FIGS. 3 and 6 the bit select circuit's modes of operation are described below.

Unselected State

In an unselected state, the BD line is held low by its corresponding bit decoder to a voltage close to $V_N$. Transistors T3 and T4 of the bit select circuit are driven into inverse saturated mode operation. Nodes 1 and 2 are clamped low by the B-C junctions of T3 and T4 to a voltage a $V_{BC}$ above the BD level. The bit lines BL and Br are pulled down to an unselected down level through resistors R3-RL and R4-RR respectively. In this state, transistors T1 and T2 are kept in slight forward conduction, so that their turn on delay is minimized when the circuit is switched. With nodes 1 and 2 being held low currents from resistors R1 and R2 are driven into the B-C junctions of T3 and T4. Large diffusion capacitance are developed across these junctions to boot strap nodes 1 and 2 up rapidly when the BD line is selected high. During the Unselected state, transistors T5 and T6 are shut off. No current exists in Schottky diodes SL, SR and D1, D2.

Selected Read

When a bit column is selected, its BD line is actively pulled up by the corresponding bit decoder to a voltage about a $V_{BE}$ below $V_P$. This forces the collectors of T3 and T4 to move up quickly at the same rate. The rapid discharge of the B-C junctions of T3 and T4 provide very fast capacitive push up action on nodes 1 and 2 respectively. While nodes 1 and 2 are moving up, transistors T1 and T2 are also being coupled ON and rise at the same rate to actively pull up the bit lines. It is this fast transient emitter follower action from T1 and T2 that enables high speed and high current driving capability on the bit lines. Since transistors T1–T2 are kept slightly ON even in standby state, and transistors T3–T4 are only used as coupling capacitors, switching delay of this circuit is therefore at its minimum. The bit lines are seen to move up as soon as the BD line starts to switch up.

During bit selection, transistors T3 and T4 are switched from inverse saturated mode to forward active mode transiently. Resistors R3 and R4 are used to limit the amount of transient forward current in these two devices, so that current load on the BD line is reduced. T3 and T4 will stay OFF after the bit lines BL-BR reach their full up levels.

In the selected READ mode, both the PDL and PDR lines are high (up at around $V_P$), Schottky diodes D1 and D2 are OFF. Transistors T1 or T2 conducts in the forward mode to provide part of the read current IL into the cell. Magnitude of this current is controlled by the potential on nodes 1 and 2, which are clamped by the transistor diodes T5 and T6 respectively to a voltage set by the UC line. (See FIG. 12). The read reference level on the UC line is generated by the bit up level clamp circuit in such a way that it tracks with the selected cell's voltages to ensure proper load current IL.

The cell's total read current (IL and IG) are supplied by resistors RL and RR in conjunction with transistors T1 and T2. Typical READ currents are set at IL$\geq$1.0 mA and IG$\geq$0.2 mA. This results in a voltage differential of about 600-700 mV across the bit lines for read sensing by the sense amplifier.

Selected WRITE

In the WRITE mode, bit line selection is similar to that of the READ as described above. The only difference here is that one of the write control lines (either PDL or PDR, depending on the data to be written) is driven negative to a voltage close to $V_N$ by the write control circuit prior to bit selection. (See FIG. 13). The lowered PDL or PDR line will clamp down either node 1 and BL or node 2 and BR through the diodes T5–D1 or T6–D2 respectively, so that when the bit rail is selected, only one side of the bit lines will be driven high to provide write current into the cell. The other side will stay at down level in order to shut off the bit line current that normally flows into the cell. This mode of write operation is denoted "Differential Mode Write" hereinafter.

During WRITE mode, node 1 or 2's up level is also clamped by the transistor diode T5 or T6 to a voltage set by the UC line. The write reference voltage is typically 600–800 mV above the READ reference voltage, so that sufficient over voltage and sufficient write current are always guaranteed to provide fast write performance. For unclamped CTS cell, writing is primarily done by driving large transient current into the cell to overcome its original state. This large transient write current (typically a few milliamperes) is sourced by either T1 or T2 from $V_P$ directly. After the cell has been written, its bit line voltage will rise up to the "1" level. Transistor T1 or T2 will be gradually turned off to remove the large transient write current. Resistor RL or RR will then supply a small write current $I_W$ to reinforce the state of the newly written cell. As in READ mode, the large transient write current is sourced directly from $V_P$ through T1 or T2. The write performance is therefore not affected by the BD line's level variation.

Deselecting

When a bit column is deselected, its corresponding bit decoder output falls to the unselected down level. Transistors T3 and T4 of the bit select circuit are driven into inverse mode operation again. Nodes 1 and 2 are pulled negative to shut off the read or write bit rail currents. The bit lines, at the same time, are also pulled down actively by these means: Schottky diodes SL and SR, inverse transistors T3 and T4, and bit rail resistors RL and RR. During bit line deselection, T3 and T4 are transiently operating in inverse active mode. After the bit lines are fully discharged to their unselected down level, T3 and T4 will be put to inverse saturated mode again. Schottky diodes SL and SR will then terminate conduction. The bit column is now said to be in an unselected state.

The disclosed bit select scheme has particular utility in arrays using CTS (Complementary Transistor Switch) cells. With this scheme, at least the following two advantages have been achieved over the known designs.

(I) Minimized bit line switching delay, hence faster array access performance. Transistor pairs T1–T3 as well as T2–T4 are configured in parallel to enable more direct coupling. Since T1 and T2 are kept lightly ON during standby state, and T3–T4 are only used as coupling capacitors during bit selection, switching delay of the bit select circuit is therefore greatly reduced.

(II) Improved bit line deselection speed, hence faster chip cycle time. During bit deselection, the bit lines are actively discharged by three means: inverse mode transistor pull down by T3–T4; Schottky diode pull down by SL–SR; and resistor pull down by RL–RR. The combination of these three discharge mechanisms enables the bit lines to be deselected more rapidly, so that next array cycle can begin sooner.

The improved bit selection circuit means, in accordance with the invention includes the following elements:

1. Two level matrix decode (FIG. 3)—First level is emitter dotting of the current switch emitter follower address receivers. Second level is the bit decoders with current switch input and high speed push-pull outputs.

2. Distributive bit select circuit (FIGS. 3 & 6). It utilizes capacitive coupling mechanism of inverse saturation transistors (T3 & T4) to enhance bit rail selection speed. The same transistors are also used in active inverse mode (when the bit column is deselected) to discharge the bit lines. It has transistors T1 and T2 to provide high speed and high transient current drive mechanism on the bit lines to enable fast READ/WRITE performance. It uses Schottky barrier diodes (SL and SR) in conjunction with the bit rail resistors RL & RR for active bit rail pull down to enable fast bit column deselection. It also uses multi-emitter transistor diodes T5 and T6 in conjunction with Schottky diodes D1 and D2 for READ/WRITE control as well as setting the operating points for the selected cell.

3. Bit up level clamp (FIGS. 3 and 7)—The selected bit lines' read and write up levels are controlled by a reference circuit (Bit UPCL) so as to enable easy operating point adjustment. This circuit is also designed, as more fully explained hereinafter, to meet various tracking requirements (such as tracking with selected drain line level in read mode).

Figure 9:
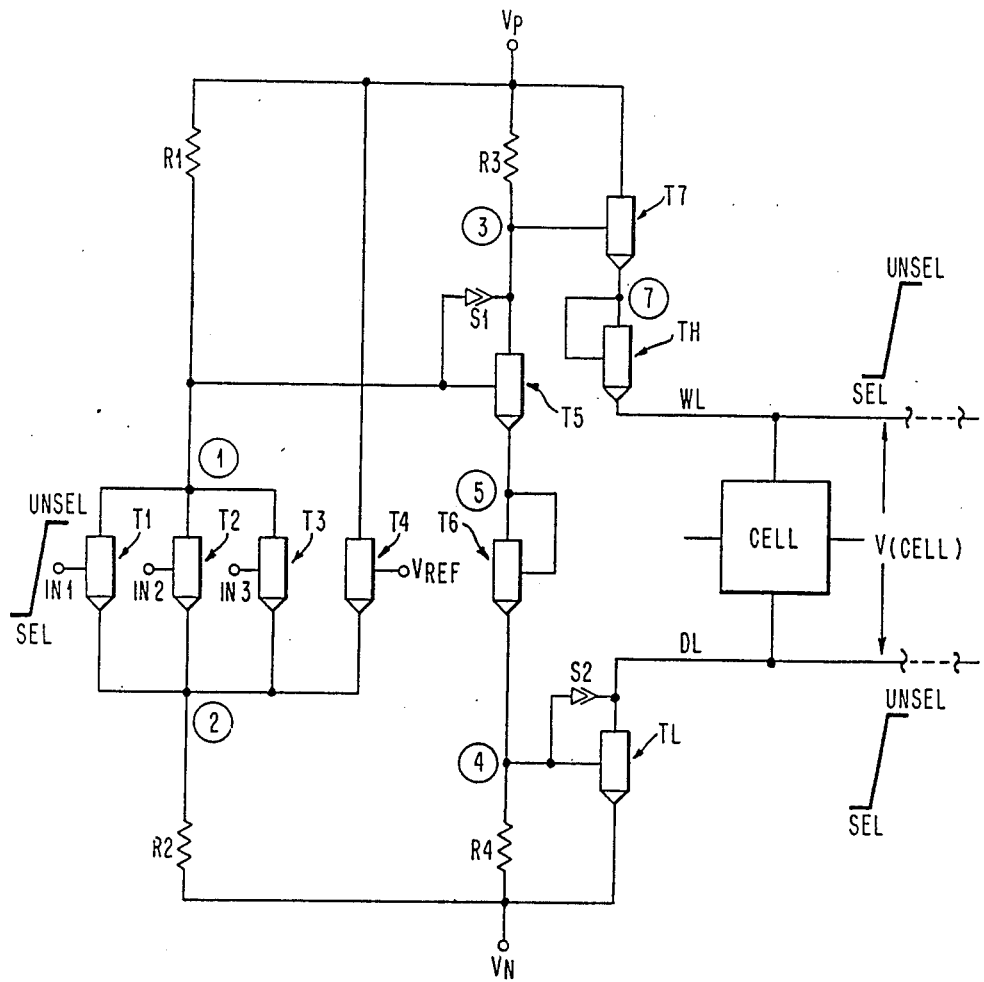
FIG. 9 illustrates the circuit diagram of the word decoder circuit in accordance ith FIG. 8 and with the invention.

The word line decoder and control circuitry represented by the block labelled "Word Decode" in FIG. 3 is shown in detail in FIGS. 8 and 9. FIG. 8 shows the voltage mode word selection scheme whereas FIG. 9 discloses in detail the circuit of the word decoder. Reference is made to U.S. patent application Ser. No. 624,486, filed June 25, 1984 now U.S. Pat. No. 4,578,779.

Referring to FIG. 8, there are 6 word addresses to decode 1 out of 64 rows. A two level matrix decode scheme similar to that of the bit path is employed for word address decoding. The first level decode includes three groups of 4 address lines (WA0-WA3, WA4-WA7, and WA8-WA11) formed from output emitter dotting of the 6 word address receivers. The word address receivers are current switch emitter follower circuits (FIG. 4). They convert the address inputs to true and complement signals. By means of emitter follower output dotting of the address receiver pairs, a partial decode of 1 out of 4 is obtained from each group, hence giving a total of three selected (low level) lines.

The second level decode function is performed by the 64 word decoders (FIG. 9). Each word decoder has three current switch inputs (IN1-IN3) and two high speed high power push-pull outputs (WL and DL). IN1 of the word decoder is connected to one of the four lines in WA0-WA3 address group. IN2 is connected to one in the second group (WA4-WA7), and IN3 is connected to one in the third group (WA8-WA11). All these three inputs have to be low in order to select a row line. The two outputs of the word decoder are connected to the word line (WL) and drain line (DL) of the memory cells as shown.

Operations of the word decoder are explained hereinafter.

Unselected state:

An unselected word decoder will have at least one of its three inputs high. Decoding transistors T1, T2 or T3 are turned ON to pull down node 1. Transistors T5 and T6 form a dual phase level shifter, so that node 4 is also pulled negative to a voltage close to $V_N$ and node 3 is pulled positive to $V_P$. With node 4 being down, the open collector transistor TL is shut off, allowing the word line WL and drain line DL to move up to their unselected (high) levels. In this state, the cells' stand-by current, as well as word and drain line voltages are defined by the current sources $I_{SBH}$ and $I_{SBL}$.

To enable fast switching speed, transistors T5 and T6 are never shut OFF but kept in slight conduction. The active pull up devices ($T_7$ and $T_H$) are OFF when the word line reaches its full unselected DC level (about one and a half $V_{BE}$ below $V_P$).

Selected state:

When a word decoder is selected, all its three inputs are low. Transistors T1, T2 and T3 are OFF. Node 1 goes high to turn ON T5 and T6 hard. Node 3 is pulled down by T5's collector to keep $T_7$-$T_H$ OFF, so that WL and DL are allowed to move down to their selected levels. At the same time, node 4 is driven high to turn ON TL. It is this high power open collector pull down action on the drain line that enables the cells to be selected fast. While the drain line is being driven low, the word line follows it at the same rate with a voltage offset defined by the cells.

When the word and drain lines are fully selected, $T_7$-$T_H$ are OFF and TL is maintained ON to sink the large READ/WRITE currents conducting from the selected cells. In this state, the word and drain line voltages are defined by following two equations:

$$V_{(DL)} = V_N + V_{CE(TL)} \quad (1)$$

$$V_{(WL)} = V_{(DL)} + V_{(CELL)} \quad (2)$$

Since the selected drain line is pulled down by a high power open collector transistor ($T_L$), word selection is therefore very fast and its drive capability is not limited by fixed current sources as in some prior designs. Furthermore, the selected drain and word line levels are solidly defined to voltages offset from power supply $V_N$, they are more stable than those of the prior art. This technique of word selection is denoted herein as "Voltage Mode Word Selection".

Deselected state:

After a row line has been selected for a READ or a WRITE operation, it is deselected back to its stand-by state. A deselecting word decoder will have at least one of its inputs go positive. Decoding transistors T1, T2 or T3 are turned ON again, driving node 1 down to shut OFF the open collector transistor $T_L$. At the same time, node 3 is pulled positive to $V_P$, driving the emitter follower devices $T_7$-$T_H$ transiently ON to pull up word line WL until it reaches its unselected DC level. While the word line is being pulled positive, drain line DL follows it up at the same rate with a voltage offset defined by the cells. When the word and drain lines are fully up at their stand-by levels, $T_7$-$T_H$ and $T_L$ are all OFF. The row line is now said to be in an unselected state.

Figure 12:
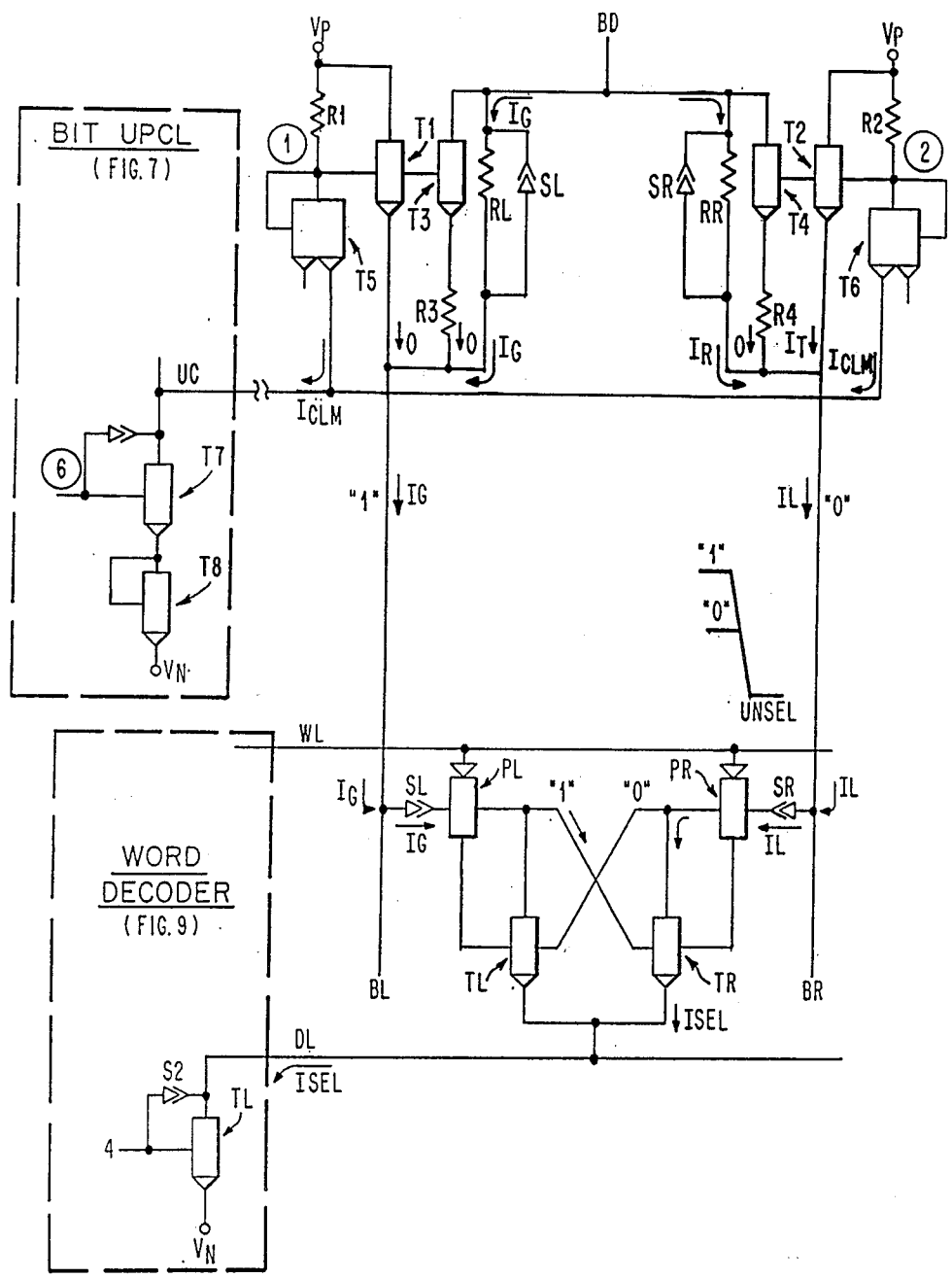
FIG. 12 is a further diagram referred to hereinafter in the explanation of the voltage mode READ operation of the RAM (FIGS. 3 & 8) in accordance with the invention.

READ operation:

A cell is selected for the READ operation when its row lines (WL, DL) and bit lines (BL, BR) are both selected (FIG. 12). The row lines are selected by the voltage mode word selection scheme as previously described. The bit lines are selected by the bit selection scheme explained earlier (FIG. 3). After a cell is fully selected, read currents $I_L$ and $I_G$ are fed into its bit rail Schottky SL and SR, which then couple the cell's internal voltages ("0" and "1") onto the bit lines for READ sensing. In order to guarantee cell stability during READ, $I_L$ and $I_G$ currents have to be controlled within a chosen operating range. This is accomplished by the bit select circuit in conjunction with the bit up level clamp circuit as described previously.

WRITE Operation

Figure 13:
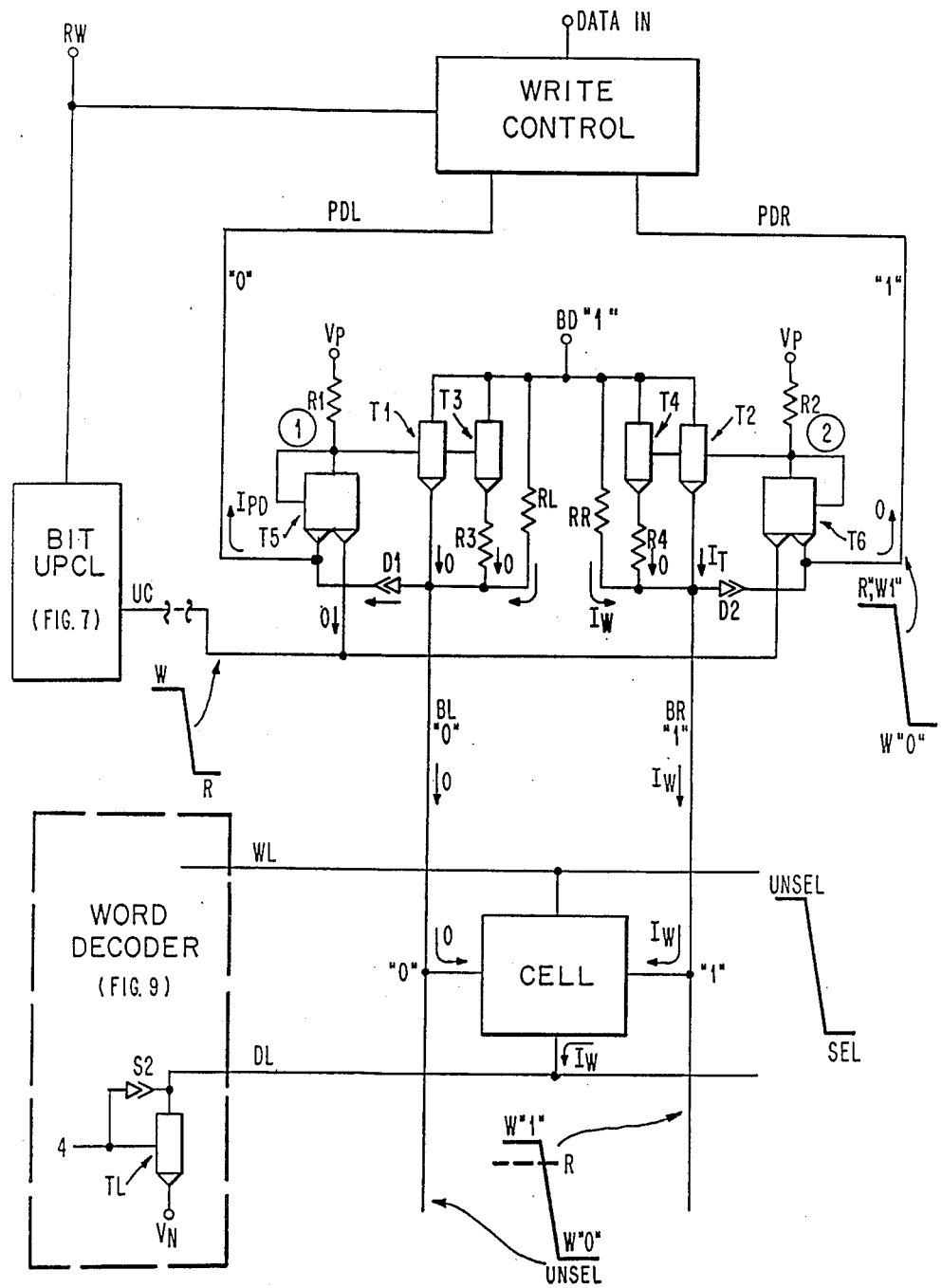
FIG. 13 is a further diagram referred to hereinafter in the explanation of the voltage mode WRITE operation of the RAM in accordance with the invention.
Figure 14:
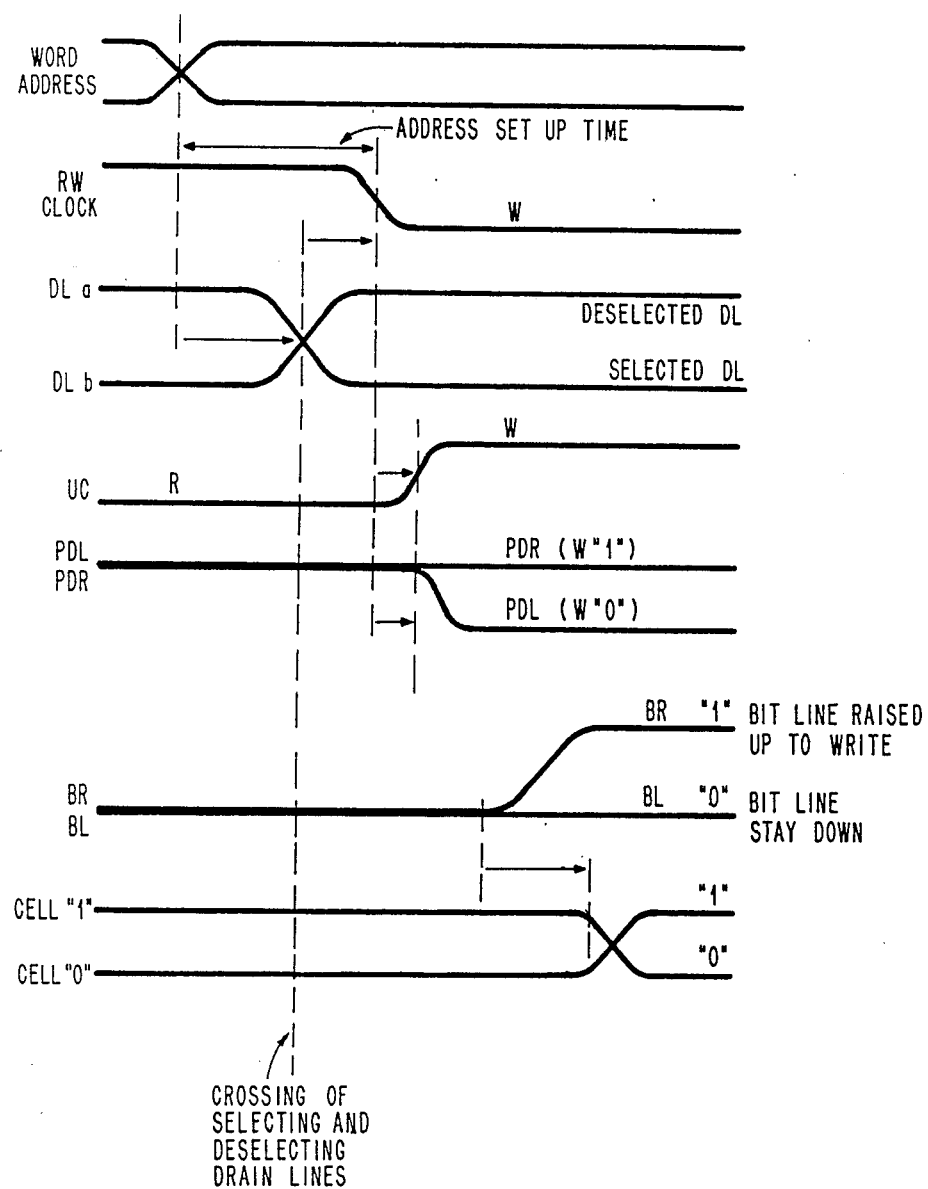
FIG. 14 discloses idealized wave forms of the "WRITE" operation timing.

With voltage mode word selection technique, WRITE operation is performed in three sequential steps (FIGS. 13 and 14).

1. The row lines are selected/deselected as previously described.

2. After crossing of the selecting and deselecting drain lines (See FIG. 14), WRITE operation is initiated. The RW clock switches the bit up level clamp circuit to generate a WRITE reference voltage on the UC line. This RW signal is also applied to a write control circuit, which depending on its data input, will drive either one of its two output lines PDL or PDR low. The lowered PDL or PDR line will then pull down node 1 and BL or node 2 and BR of the bit select circuit respectively by the transistor diodes T5/D1 or T6/D2, so that when the bit rail is selected, only one side of the bit lines will be driven high to provide WRITE current into the cell. The other side will stay at down level in order to shut off the bit line current that normally flows into this side of the cell. The shutting off of the gate current that normally flows into the cell before WRITING is essential for a successful write operation. With the presence of gate current during WRITE, the presently ON NPN transistor in the cell will remain ON and will not be able to be overcome by the write current $I_W$.

3. After the PDL or PDR line is lowered, the bit select circuit is selected. The side of the bit line to be written a "1" is raised high by the bit rail driving transistors T1 or T2. Large transient write current is injected into the cell through T1-RL or T2-RR until the desired cell state is reached. After the cell has been written, the bit line voltage of the "1" side will rise up to its normal "1" level. This reduces the potential difference across the B-E junction of T1 or T2, hence the large transient write current is shut off. The bit rail resistor RL or RR will then supply a small DC WRITE current ($I_W$) to reinforce the state of the newly written cell.

The magnitude of the transient WRITE current is controlled by a WRITE reference level applied to the bit rail driving transistor T1 or T2 through the UC line. This WRITE current can readily be adjusted by changing the bit up level clamp's WRITE reference level.

The above write scheme is denoted "Differential Mode Write", since one side of the bit line is raised high while the other side is being held low during write time.

The key advantage of this write scheme is that since the drain line is selected to a fixed voltage a $V_{CE}$ above $V_N$, when write current is injected into the cell, the level of this line will not move up but remain stable. The chasing effect with the deselecting cells as exists in "current mode" word selection scheme used by prior art designs is hence eliminated. The RW clock can now come in sooner (as soon as the selecting and deselecting drain lines cross over) without waiting for the deselecting cells to get out of the way. This minimizes address set up time required prior to write. Due to faster word selection and shorter address set up time, write performance is therefore greatly improved. Furthermore, since the selected drain lne is solidly held to a voltage level, and the deselected one is actively pulled up quickly to its unselected level, no "write through" (i.e., writing into the deselecting as well as the standby cells) problems exist.

As is submitted to be evident from the above description the use of the voltage mode word selection technique, in accordance with invention, particularly in CTS RAMs, provides the following benefit and advantages:

(1) Enables very high speed word select and deselect, hence faster "READ" performance.

(2) Provides large row lines drive capability, hence very desirable for high density applications.

(3) Stabilizes the selected drain line level, hence eliminates possible data retention and WRITE through problems.

(4) Enables faster "WRITE" performance.

Bit up level clamp circuit

The proper operation of a distributive bit selection scheme in a CTS RAM requires a bit up level clamp circuit to define the selected cell's operating points. The bit up level clamp generates a READ and a WRITE reference levels to control the cell's READ and WRITE currents. The two reference levels are generated in such a way as to track with the selected cell in temperature, power supply, and device variations, so that proper operating currents are always guaranteed under all conditions to ensure chip performance. The bit up level clamp circuit (FIG. 7) represented in FIGS. 3 and 3A by the block labelled "BIT UPCL" will now be explained with particular reference to FIGS. 8, 12 and 13.

(1) READ reference:

For a READ operation, the R/W input of the bit up level clamp circuit (FIG. 7) is high. Transistor T1 is ON and T2 of OFF, so that node 1 is up to turn ON T3 and T7. The output line UC is clamped down by T7 to generate a READ reference voltage defined by the equation below.

$$V_{UC}(READ) = V_N + 2\ V_{BE} - V_{FSBD} - \quad (1)$$

This READ reference controls the magnitude of load current IL into the cell.

Referring to FIG. 12, the voltage level required at the emitter of the clamping diode T6 in READ mode is determined by summing up the potential rises/falls from $V_N$ in the word decoder and the cell.

$$V_E(T6) = V_N + V_{BE}(T2) + V_{CE}(TR) - \quad (2)$$

Equating expressions (1) and (2), we have
$$V_{BE}(T2) = 2V_{BE} - V_{FSBD} - V_{CE}(TR) - \quad (3)$$

By selecting proper transistor and Schottky device sizes in the bit up level clamp and the bit select circuits, $V_{BE}$ and $V_{FSBD}$ of equation (3) can be adjusted to yield a desirable operating current $I_T$. As seen from equation (3), $V_{BE}$ (T2) is defined to be independent of power supply ($V_P$ & $V_N$) variations. Temperature and $V_{BE}$ trackings are also compensated. The cell's total READ current IL and $I_G$ are defined as $$I_G = [V_{BD} - V"1"]/RL$$

$$I_L = [V_{BD} - V"0"]/RR + I_T$$

$I_G$ can be adjusted by changing RL values, and $I_L$ can be adjusted by setting $I_T$ magnitude (2) WRITE reference In a WRITE mode, the R/W input is low. Transistor T1 is OFF and T2 is ON. Node 3 is high to pull up T6 while node 6 is down to shut OFF T7. The WRITE reference level at the UC line is given by:

$$V_{UC}(\text{WRITE}) = V_N + V_{BE} + V_{R4} - \quad (4)$$

This WRITE reference controls the magnitude of transient write current $I_T$ into the cell. Referring to FIG. 13, the voltage level required at the emitter of T6 is given by the following expression.

$$V_E(T6) = V_N + V_{BE}(T2) + V_{CE}(TR) - \quad (5)$$

Equating expressions (4) and (5), we have
$$V_{BE}(T2) = V_{BE} + V_{R4} - V_{CE}(TR) - \quad (6)$$

At the beginning of WRITE, TR is ON and TL is OFF, $V_{CE}(TR) \approx 0$.

$$V_{BE}(T2) \approx V_{BE} + V_{R4}$$

T2 is therefore turned ON very hard to deliver large transient write current into the cell. After write completes, TR is OFF and TL is ON, $$V_{CE}(TR) \approx V_{BE}(TL); \; V_{BE}(T2) \approx V_{R4}.$$

Transistor T2 thus shuts OFF. A small DC write current $I_W$ is then supplied by RR to reinforce the newly written cell.

As seen in equation (6), $V_{BE}(T2)$ is defined independent of power supply $V_N$. Temperature and devise variations are also compensated. The WRITE reference level can be adjusted by changing the resistor ratio of R3 and R4 in the bit up level clamp circuit Read Sensing Circuitry The operation of circuitry represented in FIG. 3 by the block labelled "sensing circuitry" will now be explained with particular reference to FIGS. 10 and 11.

Figure 3A:
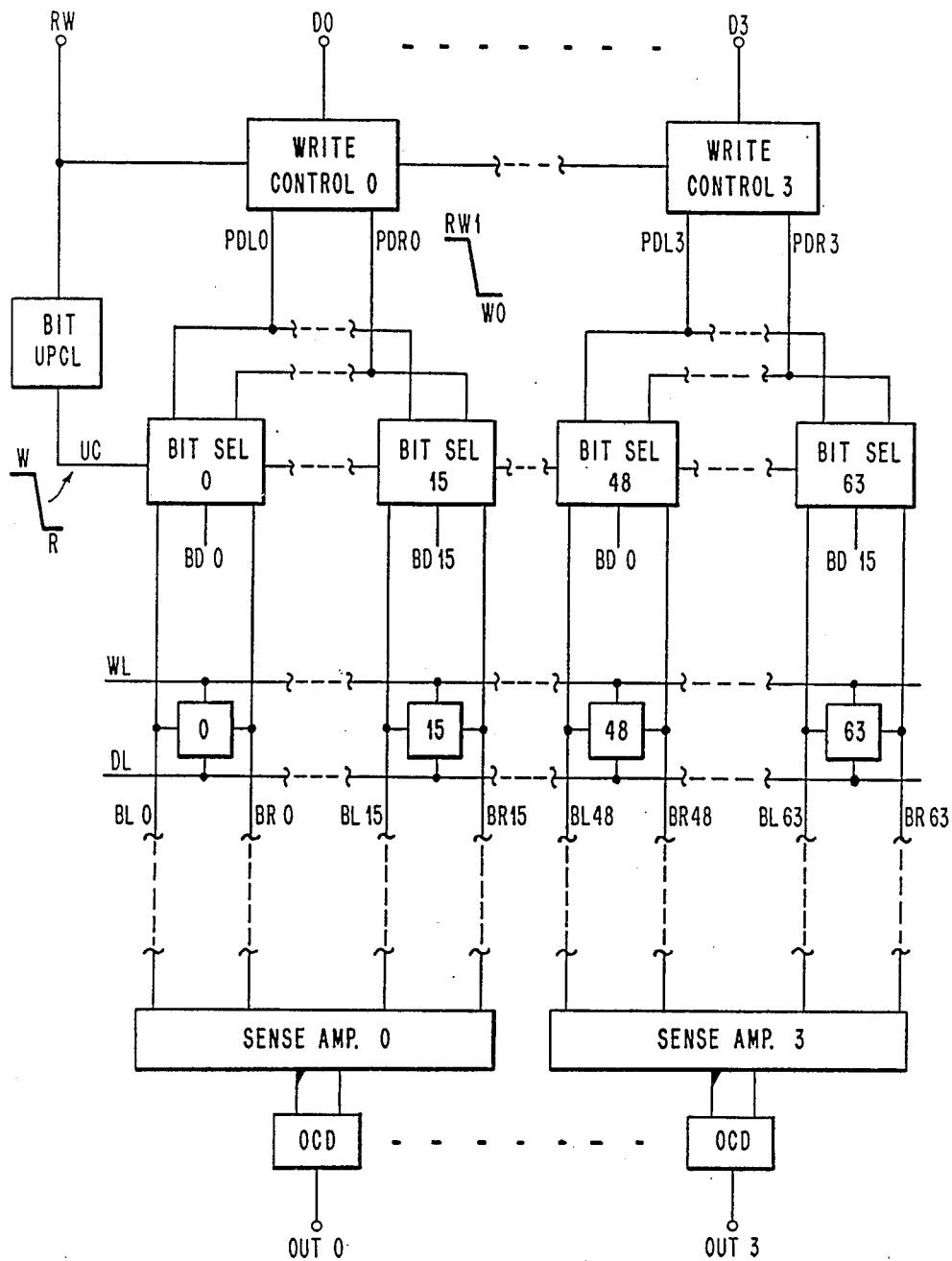
FIG. 3A (to be reviewed in conjunction with FIG. 3) illustrates the sensing and write control circuitry of the random access memory in accordance with FIG. 3 and with the invention.

FIG. 3A illustrates the sensing scheme employed for the RAM shown in FIG. 2. The 64 bit columns of this RAM is divided into four data groups of 16 bits. Each data group contains a sense amplifier (FIG. 10) for READ sensing. The state of the sense amplifier is determined by the selected cell within its data group. Data read by the sense amplifier is sent off chip through an off chip driver (OCD) circuit.

Figure 11:
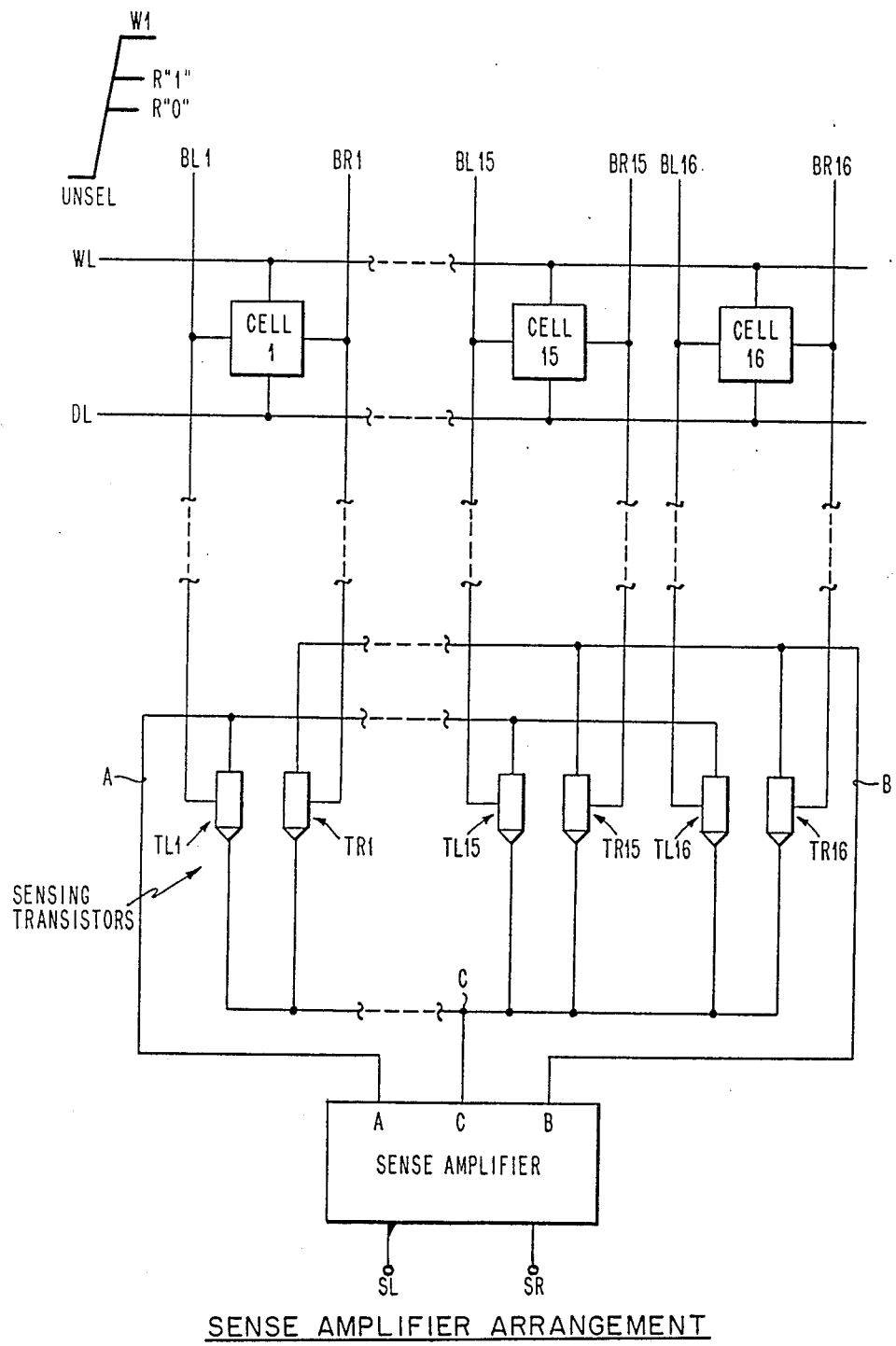
FIG. 11 is a rearrangement of, and further illustrates the senses amplifier circuitry of FIG. 10.

FIG. 11 illustrates the sense amplifier arrangement for a data group. Within a data group, each bit column has a pair of sensing transistors (TL and TR) attached to its bit lines for voltage sensing. When a cell is selected for READ, its row lines (WL and DL) are pulled down by its corresponding word decoder, and its bit lines (BL and BR) are raised up by its bit select circuit. Since there are 16 bit columns per data group, bit selection is always 1 out of 16. Of the thirty-two bit lines, only two are up at any one time. The higher of these two selected bit lines turns on the corresponding sensing transistor in the sense amplifier circuit.

Sense Amplifier Circuit Operation

Figure 10:
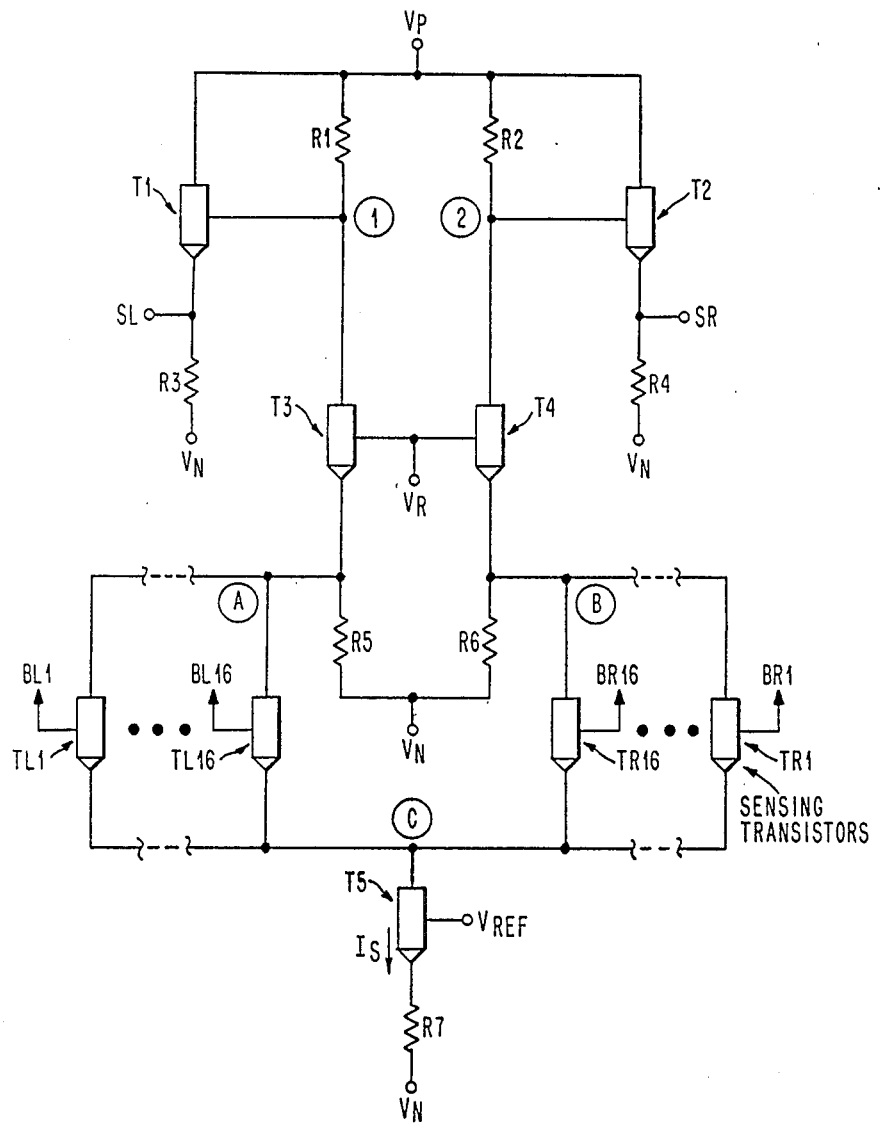
FIG. 10 illustrates the circuitry of a sense amplifier which may be employed in a RAM (FIG. 3) in accordance with the invention.

FIG. 10 illustrates a high speed sense amplifier circuit designed for the above sensing scheme. The circuit uses current steering technique to enable very fast switching performance. Its sensing speed is independent of the number of bit columns in the data group. Referring to FIG. 10, the thirty-two sensing transistors TL1 to TL16 and TR1 to TR16 form a big current switch input for the sense amplifier. The bases of these transistors are connected to the sixteen bit columns in the data group. Transistors T1 and T2 are emitter followers providing dual-phase outputs to drive the off chip driver. Transistors T3 and T4 are set to be ON all the time to define a fixed voltage at nodes A and B, so that switching of these two devices is done in current mode.

At any time, either bit-left or bit-right of a selected bit column is up at a high voltage level. The higher voltage bit line turns on its corresponding sensing transistor. The sense current $I_S$ from the current source T5 is then steered by the ON sensing transistor through either T3 or T4, pulling node 1 or 2 down accordingly.

Since voltage levels at node A and B will never be switched but remain fixed, any capacitance at these nodes, therefore will have no effect on the switching time. In fact, the circuit's delay will stay constant, disregarding the number of sensing transistors attached to its input stage. Furthermore, transistors T1, T2 and T3, T4 are active all the time; hence, their switching delay is kept to a minimum.

The features of the sense amplifier circuit in FIG. 10 are summarized as follows:

1. The sensing transistors are configurated as a big current switch, with their bases connected to bit lines within the data group. This forms the input stage of the sense amplifier.
2. The switching of the circuit is done in current mode, i.e., input voltages at A and B are fixed, and switching is performed by steering sense current $I_S$ through T3 or T4. This mode of operation enables very large fan-in capability, as well as high circuit speed independent of input loadings.
3. All switching devices (T1, T2 and T3, T4) are kept active at all times to minimize circuit delay.

It is to be appreciated, that for convenience of explanation and understanding, in the foregoing description of applicants' invention only a limited number of memory cells, word lines etc. were shown and described. Persons skilled in the art readily recognize that the size of the Array depicted in the drawing and described in the specification is not to be construed as a limitation on applicants' invention.

While this invention has been particularly described with reference to the preferred embodiments thereof, it will be understood by those skilled in the art that the foregoing and other changes in from and details may be made therein without departing from the spirit and scope of the invention.

What is claimed is:

1. A monolithic random access memory for storing binary data, said memory comprising:
    an array of memory cells having m columns and n rows, where m and n are positive integers, and said memory array including m×n memory cells, where each of said cells has the capacity to store one binary bit and each of said n rows of memory cells has the capacity to store m binary bits;
    m pairs of bit lines, each pair of said m pairs of bit lines including a first bit line BL and a second line BR;
    n pairs of word lines, each pair of said n pairs of word lines including an upper word line and a lower (drain) word line;
    each of said memory cells of said m×n array of memory cells being connected to the first bit line BL and the second bit line BR of a predetermined one of said m pairs of bit lines;

each of said memory cells of said m×n array of memory cells being also connected to the upper word line and the lower (drain) word line of a predetermined one of said n pairs of word lines;

m bit select circuits, each of said m bit select circuits having an input terminal, and a pair of output terminals connected to a discrete one of said m pairs of bit lines;

a switchable bit up level clamp circuit having an output terminal connected to each of said m bit select circuits;

bit address decoder circuit means coupled to said m bit select circuits for selecting at least one of said m bit select circuits; and word line decoder circuit means coupled to said n pairs of word lines for selecting one of said n pairs of word lines, whereby the operation of said bit address decoder circuit means in conjunction with the operation of said word line decoder circuit means selects at least a predetermined one of said m×n array of memory cells, said monolithic random access memory being further characterized in that each of said m bit select circuits includes boot-strap circuit means, for increasing the read/write speed of the memory said boot-strap circuit means including first and second transistors, said first and second transistors each having an emitter, base, and collector, said collector of said first transistor connected to the input terminal of a discrete one of said m bit select circuits, a first resistor connected between the emitter of said first transistor and the first bit line BL of an associated one of said m pairs of bit lines, said collector of said second transistor connected to the input terminal of said discrete one of said m bit select circuits, and a second resistor connected between the emitter of said second transistor and the second bit line BR of said associated one of said m pairs of bit lines, a third transistor having a collector, base, and emitter, said third transistor emitter being connected to the first bit line BL of said associated one of said m pairs of bit lines and said third transistor base being connected to the base of said first transistor, a fourth transistor having a collector, base, and emitter, said fourth transistor emitter being connected to the second bit line BR of said associated one of said m pairs of bit lines and said fourth transistor base being connected to the base of said second transistor.

2. A monolithic random access memory for storing binary data, as recited in claim 1, wherein each of said boot-strap circuit means further includes first and second parallel circuits, said first parallel circuit connected between said input terminal of said discrete one of said m bit select circuits and the first bit line BL of said associated one of said m pairs of bit lines, said second parallel circuit connected between said input terminal of said discrete one of said m bit select circuits and the second bit line BR of said associated one of said m pairs of bit lines, and each of said first and second parallel circuits including a resistor and a Schottky diode connected in parallel.

3. A monolithic random access memory for storing binary data, said memory comprising: an array of memory cells having m columns and n rows, where m and n are positive integers, and said memory array including m×n memory cells, where each of said cells has the capacity to store one binary bit and each of said n rows of memory cells has the capacity to store m binary bits;

m pairs of bit lines, each pair of said m pairs of bit lines including a first bit line BL and a second bit line BR;

n pairs of word lines each pair of said n pairs of word lines including an upper word line and a lower (drain) word line;

each of said memory cells of said m×n array of memory cells being connected to the first bit line BL and the second bit line BR of a predetermined one of said m pairs of bit lines; each of said memory cells of said m×n array of memory cells being also connected to the upper word line and the lower (drain) word line of a predetermined one of said n pairs of word lines;

m bit select circuits, each of said m bit select circuits being connected to a discrete one of said m pairs of bit lines;

a switchable bit up level clamp circuit having an output terminal connected to each of said m bit select circuits;

bit address decoder circuit means coupled to said m bit select circuits for selecting at least one of said m bit select circuits;

word line decoder circuit means coupled to said n pairs of word lines for selecting one of said n pairs of word lines; and, said monolithic random access memory being further characterized in that each of said m bit select circuits includes, first, second, third, fourth, fifth and sixth transistors, said first, second, third and fourth transistors each having an emitter, base and collector, said fifth and sixth transistors each having first and second emitters, a base and a collector, said collector of said first transistor connected to a first source of potential, said collector of said second transistor connected to said first source of potential, first connection means connecting in common said base of said first transistor, said base of said third transistor, said collector of said fifth transistor and said base of said fifth transistor, second connection means connecting in common said base of said second transistor, said base of said fourth transistor, said collector of said sixth transistor and said base of said sixth transistor, third connection means connecting in common said collector of said third transistor, said collector of said fourth transistor and said bit address decoder circuit means, a first resistor connected between said base of said first transistor and said first source of potential;

a second resistor connected between said base of said second transistor and said first source of potential, a third resistor connected between said emitter of said first transistor and said emitter of said third transistor, a fourth resistor connected between said emitter of said second transistor and said emitter of said fourth transistor, a fifth resistor connected between said emitter of said first transistor and said collector of said third transistor, a sixth resistor connected between said emitter of said second transistor and said collector of said fourth transistor, a first Schottky diode connected in parallel with said fifth resistor, a second Schottky diode connected in parallel with said sixth resistor, the first bit line (BL) of an associated one of said m pairs of bit lines being connected to said emitter of said first transistor, the second bit line (BR) of said associated one of said m pairs of bit lines being connected to said emitter of said second transistor, a third Schottky diode connected between the first bit line of an associated one of said m pairs of bit lines and said first emitter of said fifth transistor, a fourth Schottky diode connected between the second bit line of said associated one of said m pairs of bit lines and said first emitter of said sixth transistor, a common connection between said second emitters of said fifth and sixth transistors and said switchable bit up level clamp circuit output terminal, and said first emitters of said fifth and sixth transistors being connected to a write control circuit.

4. A monolithic random access memory for storing binary data, as recited in claim 3, wherein each of said memory cells is a CTS (complementary transistor switch) memory cell.

5. A monolithic random access memory for storing binary data as recited in claim 3, wherein each of said memory cells is an "unclamped" CTS (complementary transistor switch) memory cell.

6. A monolithic random access memory for storing binary data, as recited in claim 3, wherein each of said memory cells comprises:

seventh, eighth, ninth and tenth transistors, each of said seventh through tenth transistors having an emitter, base and collector, said ninth and tenth transistors being of opposite conductivity type to that of said first through eighth transistors;

a first common connection of said emitters of ninth and tenth transistors and the upper word line of a corresponding pair of said n pairs of word lines;

a second common connection of said emitters of said seventh and eighth transistors and the lower (drain) word line of said corresponding pair of said n pairs of word lines;

a third common connection of said collector of said ninth transistor, said base of said seventh transistor, said collector of said eighth transistor and said base of said tenth transistor;

a fourth common connection of said collector of said tenth transistor, said base of said eighth transistor, said collector of said seventh transistor and said base of said ninth transistor;

a fifth Schottky diode connected between said base of said ninth transistor and the first bit line BL of a respective pair of said m pairs of bit lines; and, a sixth Schottky diode connected between said base of said tenth transistor and the second bit line BR of said respective pair of said m pairs of bit lines.

7. A monolithic random access memory for storing binary data, as recited in claim 3, wherein said switchable bit up level clamp includes a read/write control input, said switchable bit up level clamp limiting the up potential of the bit line pair selected in response to said read/write control input calling for a write operation.

8. A monolithic random access memory for storing binary data, as recited in claim 7, wherein said switchable bit up level clamp circuit comprises current switch circuit means and said read/write control input is the switchable control thereof.

9. A monolithic random access memory for storing binary data, as recited in claim 8, wherein said switchable bit up level clamp circuit comprises:

seventh, eighth, ninth, tenth and eleventh transistors, each of said seventh, eighth, ninth, tenth and eleventh transistors having an emitter, base and collector, said emitters of said seventh and eighth transistors being connected in common, said read/write control input of said switchable bit up level clamp circuit being connected to said base of said seventh transistor, said base of said eighth transistor being connected to a first reference source of potential, said collector of said eighth transistor being connected to said base of said ninth transistor, said collector of said ninth transistor being connected to said base of said tenth transistor, said collector of said tenth transistor being connected to said first source of potential, said collector of said eleventh transistor being connected to said emitter of said tenth transistor, said base of said eleventh transistor being connected to said emitter of said ninth transistor, and said collector of said seventh transistor being connected to said first source of potential;

a seventh resistor, said seventh resistor connecting said collector of said eighth transistor to said first source of potential;

an eighth resistor, said eighth resistor connecting the common connection of said emitters of said seventh and eighth transistors to a second source of potential;

a ninth resistor, said ninth resistor connecting said collector of said ninth transistor to said first source of potential;

a tenth resistor, said tenth resistor connecting said emitter of said ninth transistor to said second source of potential;

an eleventh resistor, a fifth diode and a sixth diode, said eleventh resistor, said fifth diode and said sixth diode being serially connected between said collector of said ninth transistor and said second source of potential;

a seventh diode, being connected between said emitter of said eleventh transistor and said second source of potential; and, said switchable bit up level clamp circuit output terminal being connected to said emitter of said tenth transistor in each one of said m bit select circuits.

10. In a monolithic random access memory for storing binary data, as recited in claim 9, wherein said fifth, sixth and seventh diodes are respectively "diode-connected" transistors.

* * * * *